United States Patent [19]

Reddy et al.

[11] Patent Number: 5,306,958
[45] Date of Patent: Apr. 26, 1994

[54] HIGH-SPEED ADDRESS TRANSITION DETECTION CIRCUIT

[75] Inventors: Chitranjan N. Reddy, Milpitas; Ajit K. Medhekar, San Jose, both of Calif.

[73] Assignee: Alliance Semiconductor Corporation, San Jose, Calif.

[21] Appl. No.: 880,968

[22] Filed: May 6, 1992

[51] Int. Cl.$^5$ .................... H03K 3/017; H03K 5/22
[52] U.S. Cl. ..................... 307/265; 307/517; 307/236; 328/114; 328/132
[58] Field of Search .............. 307/517, 236, 265; 328/114, 132

[56] References Cited

U.S. PATENT DOCUMENTS

| | | | |
|---|---|---|---|
| 4,549,101 | 10/1985 | Sood | 307/443 |
| 4,583,008 | 4/1986 | Grugett | 307/265 |
| 4,742,247 | 5/1988 | Venkatesh | 307/517 |

Primary Examiner—Margaret R. Wambach
Attorney, Agent, or Firm—Limbach & Limbach

[57] ABSTRACT

An address detection transition circuit provides an address transition detection pulse in response to either a high-to-low or a low-to-high external address input logic transition. The address transition detection circuit includes an address input buffer that responds to the external address input by providing first and second complimentary signals at first and second address input buffer output nodes, respectively. A first delay chain connected between the first address input buffer output node and the buffer output node responds to a high-to-low external address input logic transition by providing a logic high signal at the buffer output node. Similarly, a second delay chain connected between the second address input buffer output node and the buffer output node responds to a low-to-high external address input logic transition by providing a logic high signal at the buffer output node. A pull-down device responds to a logic high signal at the buffer output node by generating a logic low address transition detection pulse at the address transition detection node. A feedback controlled network connected to the address transition detection node controls the pulse width of the address transition detection pulse.

5 Claims, 4 Drawing Sheets

HIGH-SPEED ADDRESS TRANSITION DETECTION CIRCUIT

BACKGROUND OF THE INVENTION

1. Field of the Invention

The present invention relates to memory circuits and, in particular, to a circuit capable of extremely high speed detection of an external address transition and generation of an address transition detection pulse while minimizing capacitive loading on the address buffer elements.

2. Discussion of the Prior Art

High speed memory circuits require the generation of a pulse upon detection of an external address transition. The address transition detection (ADT) pulse is utilized for deselecting and selecting memory cells, equalizing critical nodes within the memory, initiating data sensing in the memory storage elements and ultimately providing extremely fast access to the addressed data. Thus, the access time of a memory chip is a direct function of the delay between the occurrence of an address transition and the generation of the address transition detection pulse.

FIG. 1 shows a conventional address buffer and address transition detection (ATD) circuit that utilizes a pair of delay chains to feed a NOR gate network. The NOR gate network provides an output which, after propagation through a final delay stage, serves as an address transition detection pulse ATD0 for a memory array.

As further shown in FIG. 1, the address transition detection pulse ATD0 is provided to an n-channel pull-down transistor the drain of which is connected to a common address transition detection node for all address buffers in the array. A p-channel pull-up device returns the common node to logic high at the end of the address transition detection pulse.

SUMMARY OF THE INVENTION

The present invention provides an address transition detection circuit that utilizes CMOS passgates, delay chains and a feedback-controlled mechanism to achieve high speed address transition detection pulse generation while maintaining minimal loading of the address buffer elements.

An address transition detection circuit in accordance with the present invention provides an address transition detection pulse in response to either a high-to-low or a low-to-high external address input logic transition. The address transition detection circuit includes an address input buffer means responsive to an external address input for providing first and second complementary signals at first and second address input buffer output nodes, respectively. A first delay chain is connected between the first address input buffer output node and a buffer output node and responds to a high-to-low external address input logic transition for providing a logic high signal at the buffer output node. A second delay chain means is connected between the second address input buffer output node and the buffer output node and responds to a low-to-high external address input logic transition for providing a logic high signal at the buffer output node. A pull-down device responds to a logic high signal at the buffer output node by generating a logic low address transition detection pulse at an address transition detection node. A feedback-controlled network connected to the address transition detection node controls the pulse width of the address transition detection pulse.

Other features and advantages of the present invention will become apparent and be appreciated by reference to the following detailed description of the invention which should be considered in conjunction with the accompanying drawings.

A BRIEF DESCRIPTION OF THE DRAWINGS

DETAILED DESCRIPTION OF THE INVENTION

Figure 1:
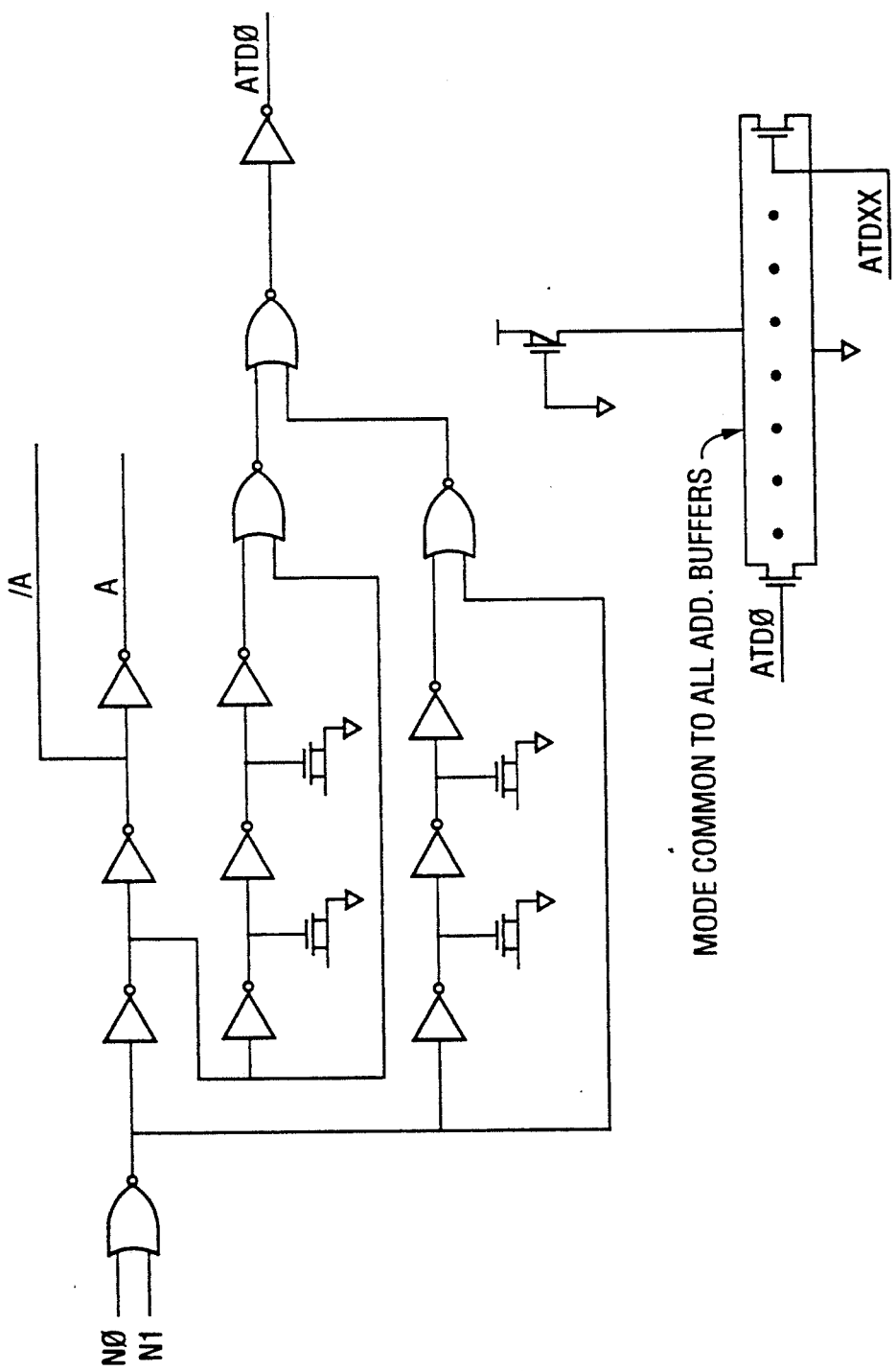
FIG. 1 is a schematic diagram illustrating a conventional address buffer and address transition detection circuit.
Figure 2:
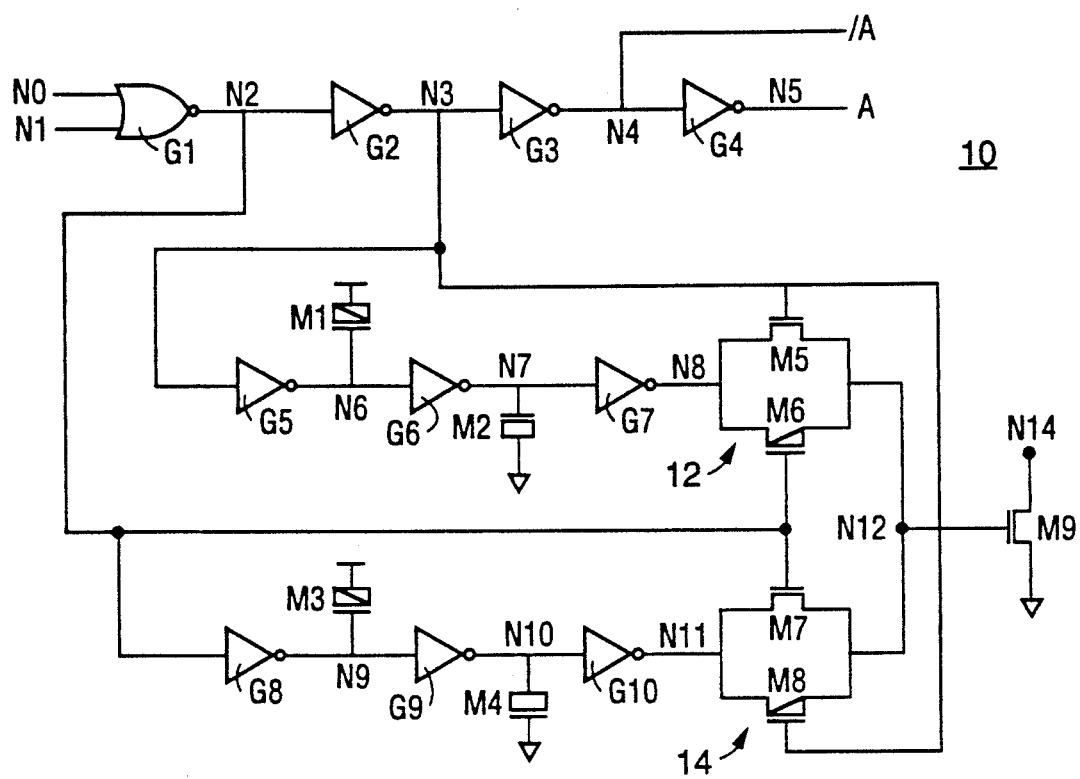
FIG. 2 is a schematic diagram illustrating a CMOS address buffer and address transition detection circuit in accordance with the present invention.

FIG. 2 shows an address buffer and address transition detection circuit 10 that includes gates G1, G2, G3 and G4. Gates G1-G4 provide an address buffer capable of translating an external TTL-level signal to an internal CMOS level compatible signal and generating signals A and /A which are used for decoding 1-of-n possible address combinations.

The circuit 10 also includes two delay chains, one consisting of gates G5, G6, G7 and MOS capacitors M1 and M2, and the other consisting of gates G8, G9, G10 and MOS capacitors M3 and M4, which determine the pulse width at node N12. CMOS pass gates for the two delay chains are provided by transistors M5 and M6 and transistors M7 and M8, respectively. Transistor M9 is used as a pull-down device for node N14, which serves as the common address transition detection node for all address buffers in an associated memory array (not shown) and for the feedback-controlled circuit discussed below in conjunction with FIG. 3.

Node N0 is an external address input, while node N1 is an internal signal used to disable the address buffer when required. For purposes of the following description, the case of node N1 being constantly low will be considered, thereby enabling the address input to propagate freely through the buffer.

With node N0 in a "high" state, the following quiescent states are present in the circuit 10: node N2 is low, node N11 is high, node N3 is high and node N8 is low. Thus, transistors M5 and M6, (i.e. passgate 12) are enabled, transistors M7 and M8 (i.e. passgate 14) are disabled, and node N12 is forced low by node N8.

Figure 3:
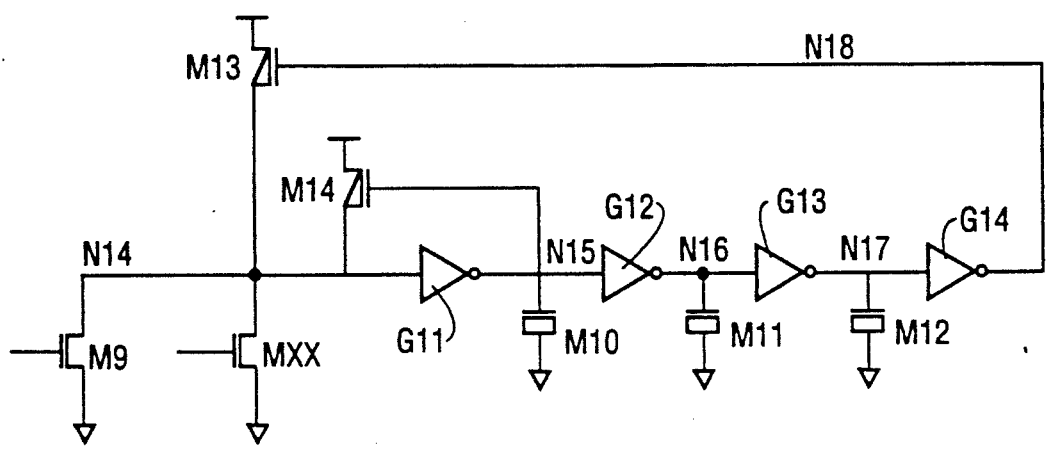
FIG. 3 is a schematic diagram illustrating a feedback-controlled address transition detection pulse generator in accordance with the present invention.
Figure 4:
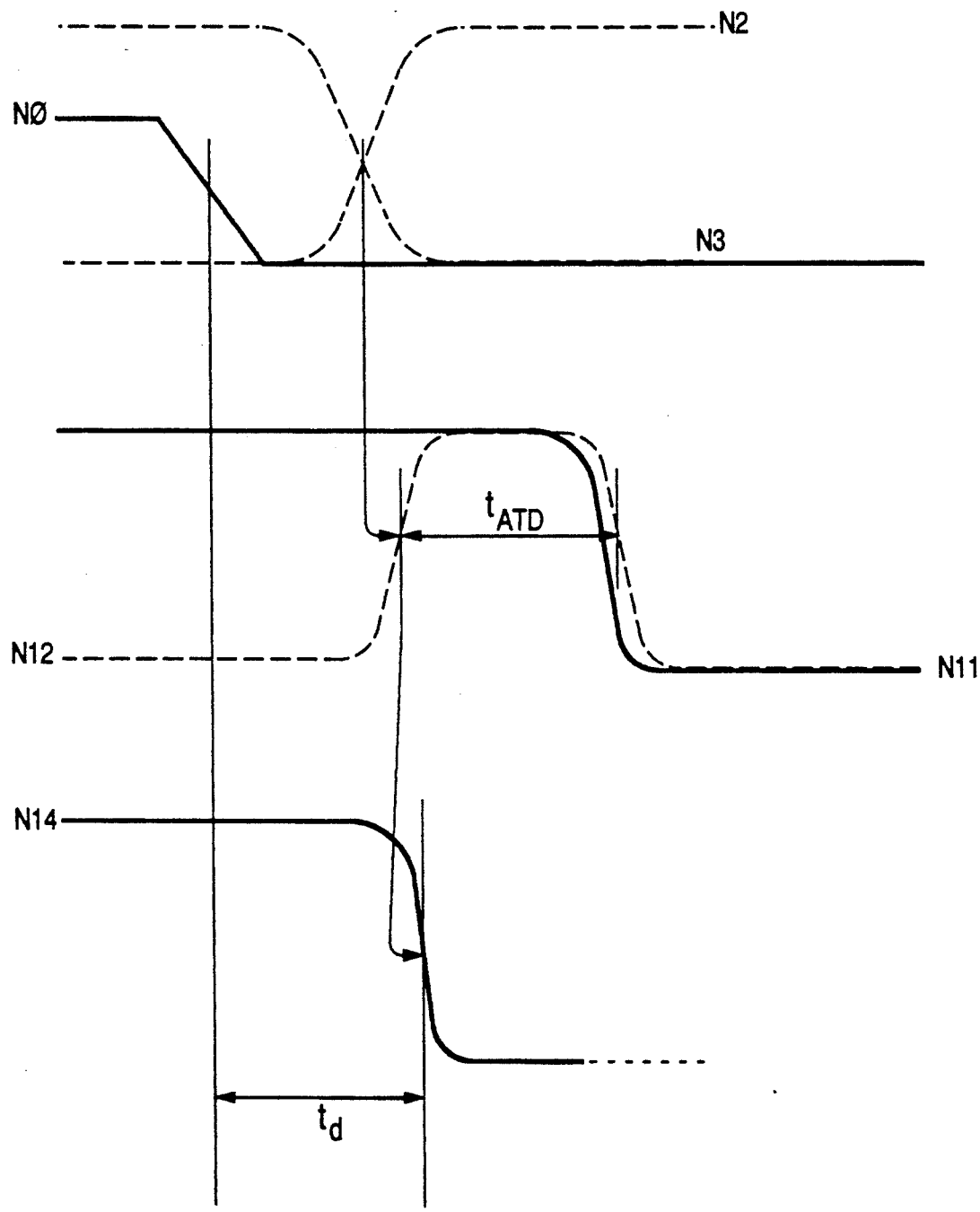
FIG. 4 is a timing diagram illustrating waveforms for the address buffer and address transition detection circuit shown in FIG. 2.

Referring to the FIG. 4 waveforms, consider the case of the external address at node N0 in FIG. 2 transitioning from high to low. Node N2 goes high immediately, enabling passgate 14, while node N3 goes low, disabling passgate 12. The high signal at node 11 propagates through passgate 14 forcing node N12 high. As soon as node N12 increases one transistor threshold Vth above ground, transistor M9 turns on and forces the address transition detection node N14 low. Subsequently, node N11 is discharged to ground after a delay determined by gates G8, G9 and G10 and MOS capacitors M3 and M4. The low-going signal at node N11 is transmitted to node N12 and turns transistor M9 off, leaving the feedback-controlled circuit of FIG. 3 to pull node N14 high.

It can be seen from FIG. 4 that the delay from the external address transition to node N14 being pulled low ($T_d$) is determined only by the length of time required to charge node N12 to one threshold above ground after node N2 has transitioned high. The width of the pulse at node N12 ($T_{ATD}$) is determined by the delay chain gates G8, G9, G10 (or gates G5, G6 and G7) and MOS capacitors M3 and M4 (or capacitors M1 and M2). The loading on gate G1 and gate G2 of the address buffer is limited to the gate capacitance of the passgates in the first stage of the delay chain.

One skilled in the art will readily appreciate that an opposite transition (i.e. low to high) on node N0 will result in similar behavior of the circuit 10.

Figure 5:
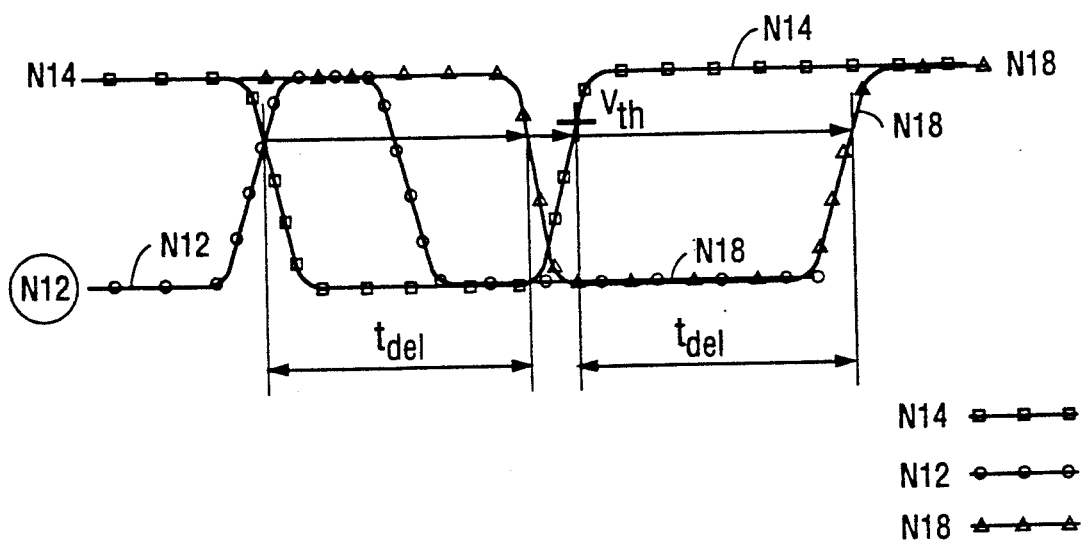
FIG. 5 is a timing diagram illustrating waveforms for a first case example of the operation of the feedback-controlled address transition detection pulse generator shown in FIG. 3.
Figure 6:
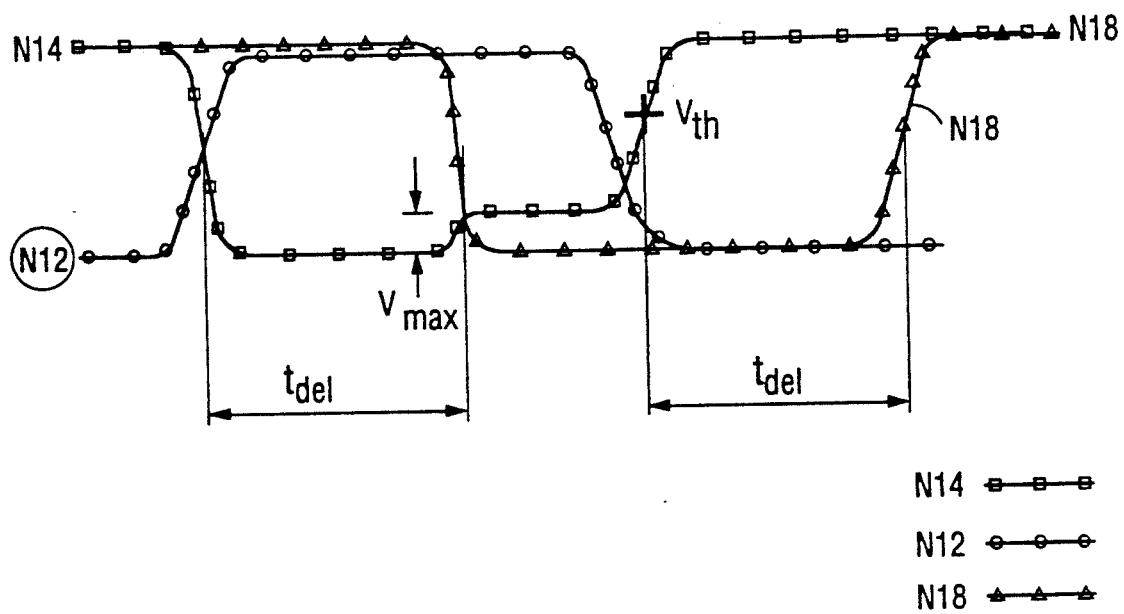
FIG. 6 is a timing diagram illustrating waveforms for a second case example of the operation of the feedback-controlled address transition detection pulse generator shown in FIG. 3.

The duration of the low-going address transition detection pulse at node N14 is determined by the feedback-controlled circuit shown in FIG. 3. Timing waveforms for the FIG. 3 circuit are shown in FIGS. 5 and 6.

In FIG. 3, transistor $M_{xx}$ represents pull-down transistors of other address buffers in the array that are similar to the one described above. Gates G11, G12, G13 and G14 and MOS capacitors M10, M11 and M12 determine the duration of the address transition detection pulse. Transistor M14 is a weak P-channel MOSFET used to maintain a quiescent high at node N14. Transistor M13 is a strong P-channel MOSFET used to terminate the address transition detection pulse and return node N14 to a high state. Since, as shown in FIG. 3, transistors M13 and M14 are driven by complimentary nodes, one skilled in the art will recognize that the rise time at node N14 can be adjusted by adjusting the sizes of transistors M13 and M14. Of critical importance to the present invention is the threshold of gate G11, which is designed to be sufficiently high to prevent premature termination of the feedback signal.

The operation of the FIG. 3 circuit will now be described.

Prior to transistor M9 of the address buffer turning on, node N14 is held high by transistor M14. As a result of node N14 being high, node N18 is also high, keeping transistor M13 off. When transistor M9 of the address buffer turns on, it easily overpowers the weak pull-up transistor M14, pulls node N14 low and starts to propagate a logic low through the delay chain G11, G12, G13 and G14 and capacitors M10, M11 and M12. After the low-going signal is propagated through to node N18 ($t_{del}$ later), transistor M13 turns on and starts to pull node N14 high. If transistor M9 and transistor $M_{xx}$ of the address buffers are off at this time ($T_{atd} < T_{del}$), then node N14 will go high immediately, propagate a high to node N18 and turn transistor M13 off, as shown in FIG. 5.

FIG. 6 shows the timing waveforms if one or more of transistors $M_{xx}$ are on ($t_{ATD} > t_{del}$) when node N18 has gone low. A DC current will flow from VCC to ground through transistors M13 and $M_{xx}$. A positive voltage will result in node N14 depending on the ratio of transistor M13 to transistor $M_{xx}$. It is imperative that the threshold of gate G11 ($V_{th}$) be higher than the highest possible voltage ($V_{max}$) that can occur at node N14 under this condition to ensure that the delay chain in the feedback loop is not triggered to turn off transistor M13. This guarantees that the address transition detection pulse remains low (valid) until at least the last of the $M_{xx}$ transistors has turned off. It also guarantees that transistor M13 will remain active to terminate the address transition detection pulse effectively when the $M_{xx}$ transistors have turned off.

The composite signal at node N14 can then be buffered and used as the global address transition detection signal for the memory array.

By including two delay chains ($T_{ADT}$ and $T_{del}$), the address transition detection circuit can be optimized for two different applications. In case one, if $T_{ATD}$ is greater than $T_{del}$, then any multiple address change with address skews will have additive effect skews on the address transition detection pulse on node N18, as shown in FIG. 6. If, however, $T_{ATD}$ is less than $T_{del}$, then the address skew can be masked on node N18 due to the $T_{ATD}$ pulse being smaller than $T_{del}$.

It should be understood that various alternatives to the structures described herein may be utilized in practicing the invention. It is intended that the following claims define the invention and that structures and methods with in the scope of these claims and their equivalents be covered thereby.

What is claimed is:

1. An address transition detection circuit that provides an address transition detection pulse in response to a logic transition of an external address input, the address transition detection circuit comprising:
   (a) a buffer output node;
   (b) an address input buffer means responsive to the external address input for providing first and second complementary signals at first and second address input buffer output nodes, respectively;
   (c) first delay chain means connected between the first address input buffer-output node and the buffer output node and responsive to a high-to-low external address input logic transition for providing a logic high signal at the buffer output node;
   (d) second delay chain means connected between the second address input buffer output node and the buffer output node and responsive to a low-to-high external address input logic transition for providing a logic high signal at the buffer output node;
   (e) an address transition detection node;
   (f) pull-down means connected to the address transition detection node and responsive to a logic high signal at the buffer output node for generating a logic low address transition detection pulse at the address transition detection node;
   (g) feedback-controlled means connected to the address transition detection node (N14) for controlling the pulse width of the address transition detection pulse.

2. An address transition detection circuit as in claim 1 wherein the first delay chain means includes a first CMOS passgate responsive to a logic high signal at the first address input buffer output node and a logic low signal at the second address input buffer output node for providing a logic high signal at the buffer output node, and wherein the second delay chain means includes a second CMOS passgate responsive to a logic low signal at the first address input buffer output node and a logic high signal at the second address input buffer output node for providing a logic high signal at the buffer output node.

3. An address transition detection circuit as in claim 1 wherein the feedback-controlled means comprises:
  (a) a plurality of series-connected delay gates, an input of the first of the plurality of delay gates being connected to the address transition detection node;
  (b) a first P-channel MOSFET having its drain connected to the address transition detection node, its source connected to a positive supply, and its gate connected to the output of the first of the plurality of delay gates for maintaining a quiescent high logic level at the address transition detection node; and
  (c) a second P-channel MOSFET having its source connected to the address detection node, its drain connected to the positive supply, and its gate connected to an output of the last of the plurality of delay gates for terminating the address transition detection pulse and returning the address transition detection node to logic high.

4. An address transition detection circuit as in claim 3 wherein the threshold voltage of the first of the plurality of delay gates is sufficiently high to prevent premature termination of the address transition detection pulse.

5. An address transition detection circuit as in claim 3 wherein the size of the first P-channel MOSFET and the size of the second P-channel MOSFET are preselected to provide a corresponding preselected rise time on the address transition detection node.

* * * * *